United States Patent [19]

Haycock et al.

[11] Patent Number: 5,410,267

[45] Date of Patent: Apr. 25, 1995

[54] 3.3V TO 5V SUPPLY INTERFACE BUFFER

[75] Inventors: Matthew B. Haycock; Stephen R. Mooney, both of Beaverton, Oreg.

[73] Assignee: Intel Corporation, Santa Clara, Calif.

[21] Appl. No.: 126,334

[22] Filed: Sep. 24, 1993

[51] Int. Cl.6 ............... H03K 19/0175; H03K 19/094
[52] U.S. Cl. ........................................ 326/81; 326/83
[58] Field of Search ................. 307/475, 451; 326/81, 326/83

[56] References Cited

U.S. PATENT DOCUMENTS

| | | | |
|---|---|---|---|
| 4,656,373 | 4/1987 | Plus | 307/475 |
| 4,695,744 | 9/1987 | Giordano | 307/475 |
| 4,864,159 | 9/1989 | Cornelissen | 307/475 |
| 4,978,870 | 12/1990 | Chen et al. | 307/475 |
| 4,996,443 | 2/1991 | Tateno | 307/475 |
| 5,144,165 | 9/1992 | Dhong et al. | 307/475 |
| 5,191,233 | 3/1993 | Nakano | 307/475 |
| 5,204,557 | 4/1993 | Nguyen | 307/475 |
| 5,241,225 | 8/1993 | Okajima et al. | 307/475 |
| 5,243,236 | 9/1993 | McDaniel | 307/475 |
| 5,250,856 | 10/1993 | Burton et al. | 307/475 |
| 5,311,075 | 5/1994 | Usuki | 307/475 |
| 5,311,083 | 5/1994 | Wanlass | 307/475 |

OTHER PUBLICATIONS

Takahashi, Makoto, Saukrai, Takayasu, Sawada, Kazuhiro, Nogami, Kazutaka, Ichida, Makoto and Matsuda, Koji, Titled "3.3V–5V Compatible I/O Circuit without Thick Gate Oxide", *Proceedings of the IEEE 1992 Custom Integrated Circuits Conference*, 1992 IEEE, pp. 23.3.1–23.3.4.

DeClercq, Michel J., Schubert, Martin, and Clement, Francois, Titled "TP10.6: 5V-to-75V CMOS Output Interface Circuits", *1993 IEEE International Solid-State Circuits Conference Digest of Technical Papers*, Publisher John H. Wuorinen, First Edition, Feb. 1993, IEEE Catalog Number 93CH3272-2, pp. 162 and 163.

*Primary Examiner*—David R. Hudspeth
*Assistant Examiner*—Richard Roseen
*Attorney, Agent, or Firm*—Blakely, Sokoloff, Taylor & Zafman

[57] ABSTRACT

An improved 3.3 V to 5 V interface buffer comprising a solid state BiCMOS device implemented on a reduced voltage process designed to operate from 3.3 V and 5 V supplies and capable of receiving a 0–3.3 V input signal while providing a external swing signal from 0–5 V. Specifically, cross coupled PMOS and NMOS devices manufactured by a 3.3 V process are utilized with level shifting diodes for achieving a device which operates on higher voltages than conventional circuit design techniques allow for a given process technique, while providing a 0–5 V output at the sending device.

14 Claims, 4 Drawing Sheets

3.3V TO 5V SUPPLY INTERFACE BUFFER

BACKGROUND OF THE INVENTION

1. Field of the Invention

The present invention relates generally to digital solid state integrated circuits. More particularly, the present invention relates to interfacing circuits implemented using different fabrication processes.

2. Description of Related Art

Interfacing electronic devices which operate on different supply voltages and which necessarily present different input and output characteristics is a problem that has long been known in the art. As digital integrated circuits and the devices which they operate become smaller and smaller, much as in the portable computer market, designers have focused on ways to reduce the size, and also accordingly, the power consumption of each component in a given electronic device. In one particular example, designers have begun to develop digital integrated circuits which operate on 3.3 V references, thereby realizing as much as a 40% power reduction from their predecessors utilizing 5 V references. Because of the advent of digital integrated circuits which operate at 3.3 V, the particular problem of interfacing the input and output characteristics of 3.3 V devices with the more commonly used 5 V devices has presented designers with a wide variety of problems.

In the prior art, designers have typically interfaced 3.3 V devices and 5 V devices by means of an external voltage level translator operated from a 5 V supply. These external voltage level translators receive a given 0–3.3 V input signal from a 3.3 V device and adjust the output level so as to present a 0–5 V output level signal to the receiving 5 V device. However, inherent in this external translator solution, designers have had to make sacrifices. Performance characteristics, particularly speed and reliability, are reduced in any implementation where the input device must rely on a second device, not able to be located on the same die, for achieving the proper interface voltages. Additionally, more components again take up more space, thereby reducing the gain realized by utilization of 3.3 V devices.

Heretofore, designers have not been able to implement the level transition required at a sending device due to the inherent limitations of the manufactured 3.3 V devices. In order to achieve the size, speed and power consumption goals, a typical BiCMOS fabrication process designed to operate at 3.3 V would have gate oxide thicknesses in the range from 80–150 Å with drawn gate lengths from 0.6–0.8 μm (as compared to a typical 5 V process with gate oxide thicknesses of 150–250 Å and drawn gate lengths greater than or equal to 0.9 μm). While power consumption goals have been achieved, the reduced voltage manufacturing 3.3 V process (hereinafter the 3.3 V process) provides a relatively thin gate oxide and narrow channels that prevent the devices fabricated using a 3.3 V process from being operated at voltages above 3.3 V. At voltages above 3.3 V, hot electron effects and gate oxide breakdown are two of the reliability problems that are well known in the 3.3 V process art.

In the competitive digital integrated circuit market, power consumption, speed, reliability, and compatibility are hallmarks for comparing products produced by different vendors. The ability of a digital integrated circuit to provide an on-chip buffered output for interfacing with more conventional 5 V devices would represent a significant improvement to digital integrated circuit interfhcin g art.

SUMMARY OF THE INVENTION

In summary, the present invention provides an improvement in interfacing 3.3 V output and 5 V input devices by means of a solid state BiCMOS device implemented on a reduced voltage process designed to operate from 3.3 V and 5 V supplies and capable of receiving a 0–3.3 V input signal while providing a external swing signal from 0–5 V. Specitically, cross coupled PMOS and NMOS devices manufactured by a 3.3 V process are utilized with level shifting diodes for achieving a device which operates on higher voltages than conventional circuit design techniques allow for a given process technique, while providing a 0–5 V output at the sending device.

To overcome the limitations of the prior art, it is an object of the present invention to implement an output buffer which provides a 0–5 V output swing signal utilizing 3.3 V BiCMOS process devices.

It is a further object of the present invention, to implement a digital integrated circuit providing a 3.3 V input buffer with 0–5 V output utilizing 3.3 V BiCMOS process devices operated by both 3.3 V and 5 V supplies while maintaining all transistor voltages at less than 3.3 V.

Finally it is an object of the present invention to implement cross coupled NMOS and PMO S transistors and level shifting diodes fabricated utilizing a BiCMOS 3.3 V process to achieve a 3.3 V compatible interface circuit for use in 3.3 V digital integrated circuit devices.

The apparatus comprises a BiCMOS output buffer circuit, implemented on a 3.3 V process, which is designed to switch between 0 V and 5 V and includes a first predriver circuit having cross coupled PMOS devices coupled to an N channel output driver, both of which are referenced to 3.3 V, for providing a low output signal. The buffer further includes a second predriver circuit with level shifting diodes and cross coupled PMOS devices coupled to a P-channel output driver, both of which are referenced to 5 V, for providing the 5 V high output signal.

Additional objects and features of the invention will be more readily apparent from the following detailed description of the preferred embodiment and appended claims when taken in conjunction with the drawings provided herein.

DETAILED DESCRIPTION OF THE PREFERRED EMBODIMENT

Figure 1:
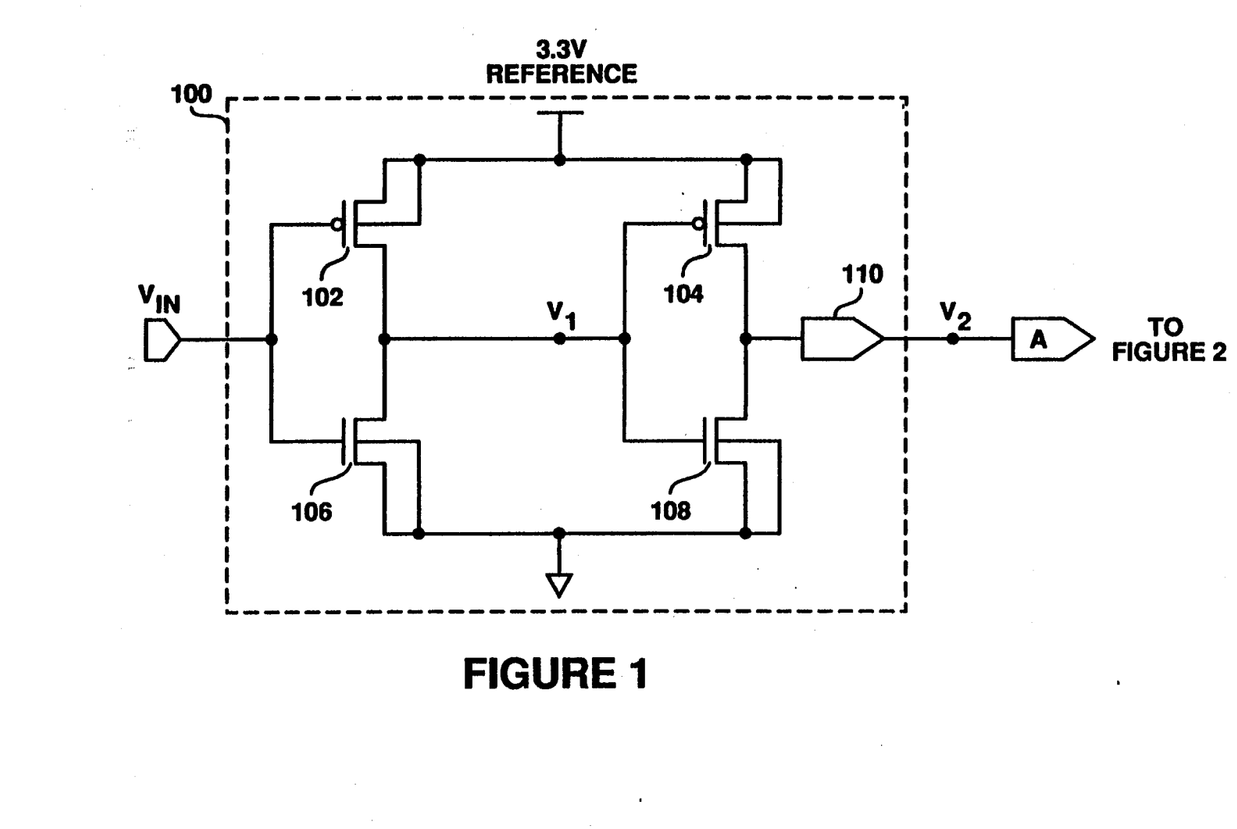
FIG. 1 is a schematic diagram of a first driver circuit of the preferred embodiment of the present invention.

Referring first to FIG. 1, a schematic of a solid state digital electronic circuit incorporating a first driver circuit 100 of the preferred embodiment of the present invention is shown. A 0–3.3 V input signal $V_{in}$ in is coupled to the first driver circuit 100 comprising PMOS enhancement mode transistors 102 and 104 and NMOS enhancement mode transistors 106 and 108. In the preferred embodiment of the present invention, the PMOS transistors are fabricated of a gate width of 24 μm and a gate length of 0.6–0.7 μm nominally, while the NMOS transistors are fabricated of a of gate width of 9 μm and a gate length of 0.6–0.7 μm nominally. Methods for fabricating NMOS and PMOS transistors with these gate dimensions in a 3.3 V process are well known to those of ordinary skill in the art.

The transistors in the first driver circuit 100 are configured such that the drain port of PMOS transistor 102 is coupled to the drain port of NMOS transistor 106 and simultaneously to the respective gate inputs of PMOS transistor 104 and NMOS transistor 108, thereby forming node $V_1$. The source ports of both the PMOS transistors 102 and 104 are coupled to a 3.3 V reference, while their counterpart source ports of the NMOS transistors 106 and 108 are coupled to a ground reference. Finally the drain ports of the PMOS transistor 104 and the NMOS transistor 108 are coupled at node $V_2$, yielding a first output signal 110 from the first driver circuit 100.

Input signal $V_{in}$ is coupled to the gate inputs of both the PMOS transistor 102 and NMOS transistor 106 such that as the input signal $V_{in}$ swings from a potential of 0 to 3.3 V, the PMOS transistor 102 turns off, creating an open circuit between the drain port and source port in the PMOS transistor 102 as the gate to source input voltage becomes less negative than the threshold voltage $V_p$ associated with a PMOS device. Simultaneously, the NMOS transistor 106 turns on, creating a conductive path from the drain port to the source port in the NMOS transistor 106 as the gate to source voltage exceeds the threshold voltage $V_{tn}$ associated with an NMOS device, thereby driving the common drain ports of PMOS transistor 102 and NMOS transistor 106 at node $V_1$ to the ground reference. In the preferred embodiment of the present invention, the threshold voltages $V_{tp}$ (absolute value) and $V_{tn}$ for all of the PMOS and NMOS devices selected are approximately 0.5 V–0.7 V. Those of ordinary skill in the art will recognize that the threshold voltage level may be selected from any value that will assure that a complete activation or deactivation will occur for all devices as the gate potential for the NMOS and PMOS devices varies 3.3 V between activated and deactivated states.

As node $V_1$ transitions to the ground reference, PMOS transistor 104 turns on reflecting a gate to source voltage more negative than the threshold voltage $V_{tp}$ of a PMOS device. Simultaneously, the NMOS transistor 108 turns off, refl.ecting a gate to source voltage less than the threshold level $V_{tn}$ for an NMOS device, thereby resulting in a 3.3 V first output signal 110 at node $V_2$ from the first driver circuit 100. Those of ordinary skill in the art will realize that as the input voltage $V_{in}$ swings back from 3.3 V to 0 V, a directly opposite condition than described above will occur, resulting in transistors 102 and 108 turning on, while transistors 104 and 106 turn off, yielding a 0 V first output signal 110 at node $V_2$. Those of ordinary skill in the art will also recognize that the paired PMOS and NMOS configuration functions as a follower circuit, exactly matching the input $V_{in}$ at the output 110 of the first driver circuit 100.

Figure 2:
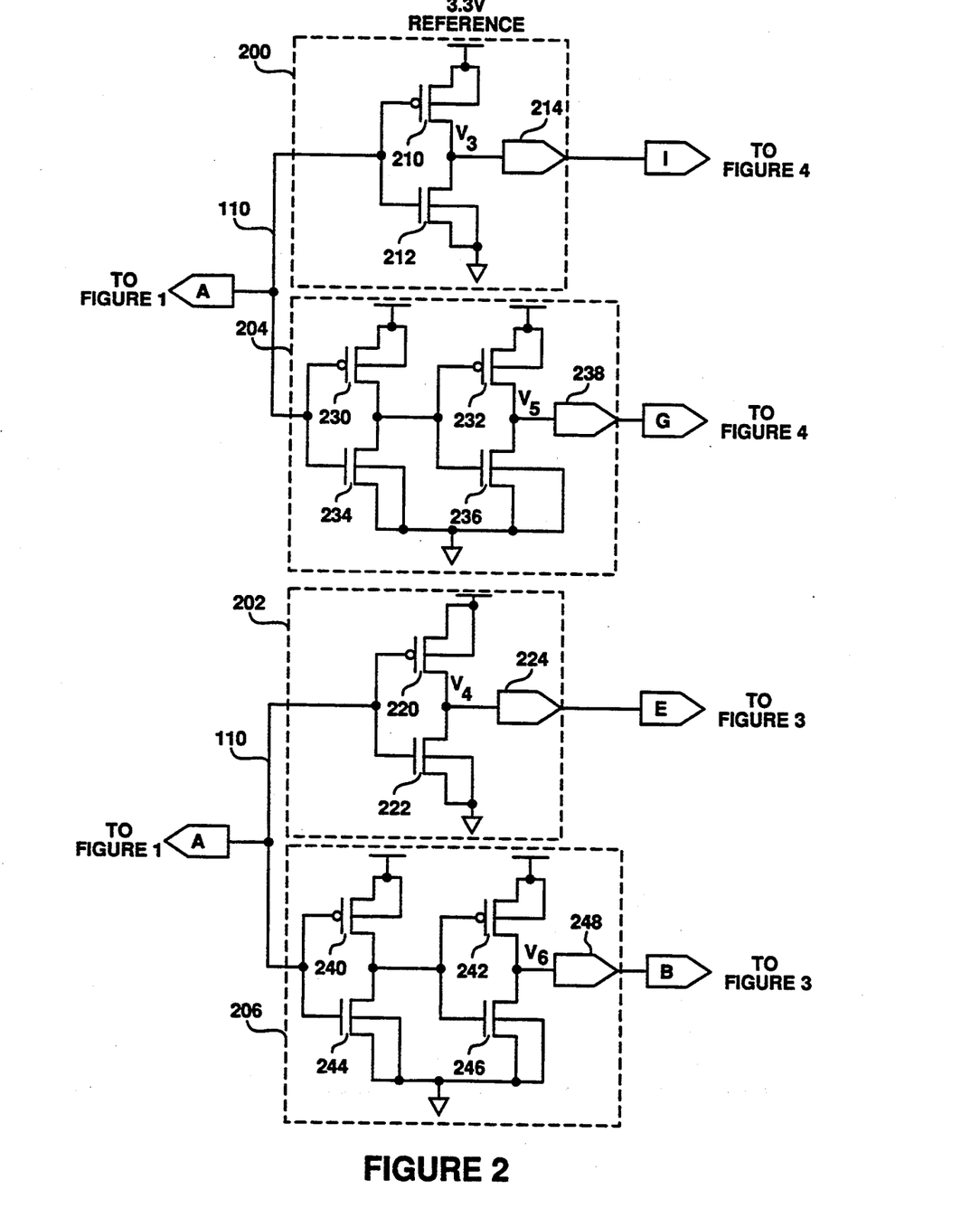
FIG. 2 is a schematic diagram of a first driver circuit coupled to first and second inverter and follower circuits of the preferred embodiment of the present invention.

Referring now to FIG. 2, the first output signal 110 is coupled to a first inverter 200 and second inverter 202 and a first follower circuit 204 and second follower circuit 206. Inverter 200 is comprised of an enhancement mode PMOS transistor 210 whose gate input is coupled to the gate input of an enhancement mode NMOS transistor 212 and the first output signal 110. The source of the PMOS transistor 210 is referenced to 3.3 V, while the source port of the NMOS transistor 212 is coupled to a ground reference. The drain ports of the PMOS transistor 210 and NMOS transistor 212 are coupled at node $V_3$ resulting in a first inverter output 214. As the first output signal 110 varies from a potential 0 V to 3.3 V, the first inverter output signal 214 at node $V_3$ swings from a potential of 3.3 V to 0 V. In the preferred embodiment of the present invention, the PMOS transistors are fabricated of a gate width of 36 μm and a gate length of 0.6–0.7 μm, nominally, while the NMOS transistors are fabricated of a gate width of 9 μm and a gate length of 0.6–0.7 μm, nominally. These gate dimensions correspond to those created with a 3.3 V fabrication process.

A second inverter 202, identical to first inverter 200, is comprised of an enhancement mode PMOS transistor 220 and an enhancement mode NMOS transistor 222 with coupled drain ports at node $V_4$. The second inverter 202 further comprises a second inverter output 224 responsive to the first output signal 110. In the preferred embodiment of the present invention the PMOS transistors were fabricated of a gate width of 8 μm and a gate length of 0.6–0.7 μm, nominally, while the NMOS transistors were fabricated of a gate width of 3 μm and a gate length of 0.6–0.7 μm, nominally. Again, fabrication of inverter 202 is accomplished using a 3.3 V process.

A first follower 204, identical to the first driver circuit 100, receives the first output signal 110 at the coupled gate inputs of an enhancement mode PMOS transistor 230 and an enhancement mode NMOS transistor 234. The drain ports of PMOS transistor 230 and NMOS transistor 234 are coupled to the gate inputs of PMOS transistor 232 and NMOS transistor 236. The drain ports of PMOS transistor 232 and NMOS transistor 236 are coupled at node $V_5$ yielding a first inverter output signal 238. As was disclosed previously, this configuration will result in the first inverter output signal 238 following the first output signal 110, which serves as the input to the first follower 204. In the preferred embodiment of the present invention, the PMOS transistors are fabricated of a gate width of 16 μm (transistor 230) and 48 μm (transistor 232) and a gate length of 0.6–0.7 μm, nominally, while the NMOS transistors are fabricated of a gate width of 6 μm (transistor 234) and 18 μm (transistor 236) and a gate length of 0.6–0.7 μm, nominally.

A second follower 206, identical to follower 204, comprises enhancement mode PMOS transistors 240 and 242 coupled to enhancement mode NMOS transistors 244 and 246. The drain ports of PMOS transistor 242 and NMOS transistor 246 are coupled at node $V_6$, yielding a second follower output 248. Those of ordinary skill in the art will realize that the first driver circuit 100 and the follower circuits 204 and 206 serve no logic function, as the outputs to each of these devices merely tracks the inputs provided. However, those of ordinary skill in the art will realize that the devices provide drive capability, accounting for any fan-out considerations, and, as such, may or may not be required in all applications. In the preferred embodiment, first driver circuit 100 and followers 204 and 206 provide added circuit stability and drive capacity.

In the preferred embodiment of the present invention the PMOS transistors are fabricated of a gate width of 8 $\mu$m (transistor 240) and 24 $\mu$m (transistor 242) and a gate length of 0.6–0.7 $\mu$m, nominally, while the NMOS transistors are fabricated of a gate width of 3 $\mu$m (transistor 244) and 9 $\mu$m (transistor 246) and a gate length of 0.6–0.7 $\mu$m. nominally.

Figure 3:
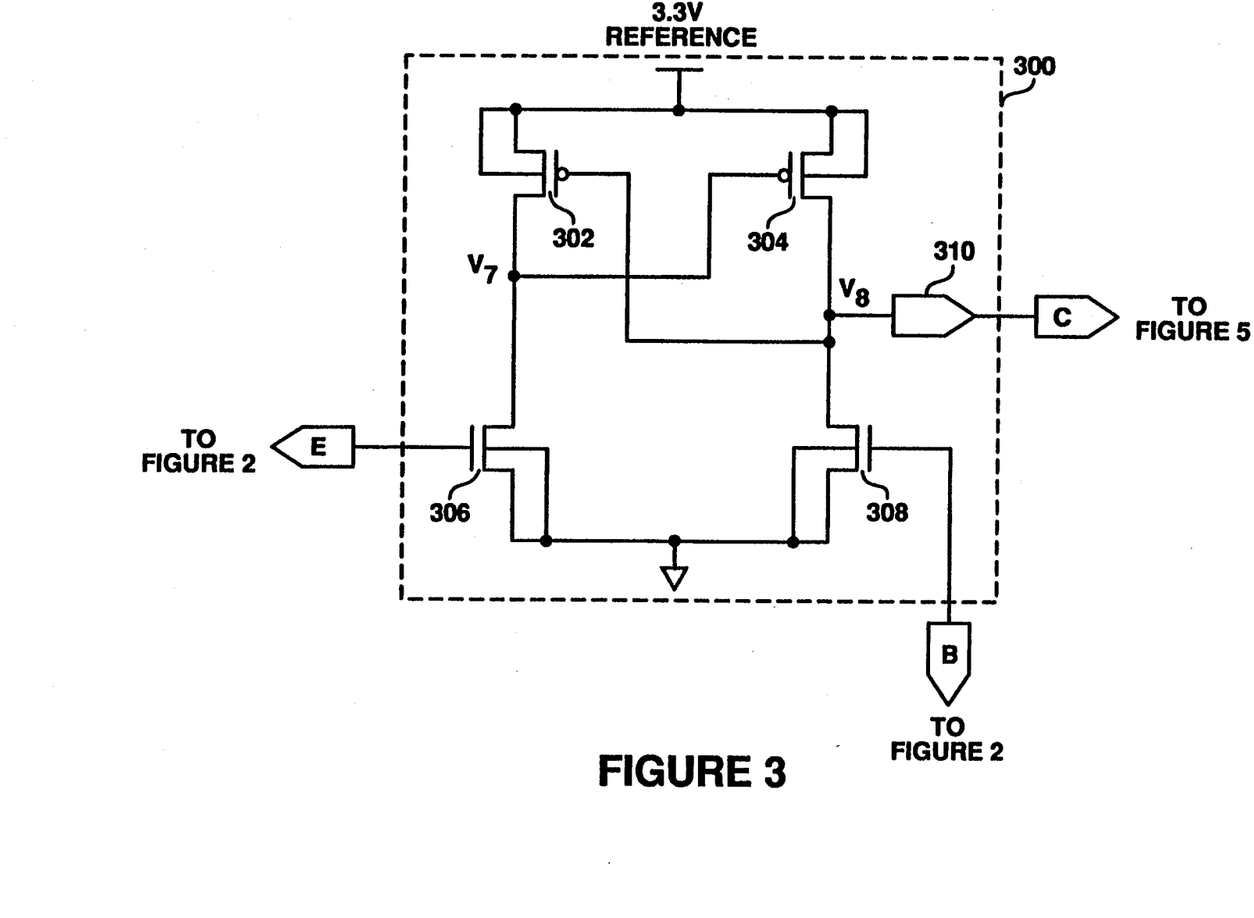
FIG. 3 is a schematic diagram of a N-channel predriver circuit of the preferred embodiment of the present invention.

Referring now to FIG. 3, an N-channel predriver 300 is shown comprising cross coupled enhancement mode PMOS transistors 302 and 304 and enhancement mode NMOS transistors 306 and 308. The source ports of the PMOS transistors 302 and 304 are coupled to a 3.3 V reference voltage, while their counterpart source ports in the NMOS transistors 306 and 308 are coupled to a ground reference. The gate input of the PMOS transistor 304 is coupled to the drain port of the PMOS transistor 302 and to the drain port of NMOS transistor 306 at node $V_7$. The gate input of the PMOS transistor 302 is coupled to the drain port of PMOS transistor 304 and to the drain port of NMOS transistor 308 at node $V_8$, yielding N-channel predriver output 310. The gate input of NMOS transistor 308 is coupled to the second follower output 248 at node $V_6$ illustrated at connector B in FIG. 2, while the gate input of the opposing NMOS transistor 306 is coupled to the second inverter output 224 at node $V_4$ illustrated at connector E in FIG. 2.

In the preferred embodiment of the present invention, the PMOS transistors are fabricated of a gate width of 16 $\mu$m (transistor 302) and 32 $\mu$m (transistor 304) and a gate length of 0.6–0.7 $\mu$m, nominally, while the NMOS transistors are fabricated of a gate width of 12 $\mu$m (transistor 306) and 24 $\mu$m (transistor 308) and a gate length of 0.6–0.7 $\mu$m, nominally.

According to the preferred embodiment of the present invention, as $V_{in}$, illustrated in FIG. 1, is varied from a potential of 0 V to 3.3 V, the first driver circuit 100 couples a 0 V to 3.3 V potential signal at the first driver output 110 to the second inverter 202 and second follower 206 illustrated in FIG. 2. The second follower 206 responds to the 0 V–3.3 V potential transition by providing a similar 0 V to 3.3 V potential transition via the second follower output 248 to the gate input of NMOS transistor 308 illustrated in FIG. 3. Simultaneously, the second inverter 202 provides a 3.3 V–0 V potential signal via the second inverter output 224, illustrated in FIG. 2 to the gate input of the NMOS transistor 306 of the N-channel predriver 300 illustrated in FIG. 3.

As the gate to source potential at NMOS transistor 308 exceeds the threshold Vm for the NMOS device, the NMOS transistor 308 turns on creating a conductive path between the drain and source ports of the NMOS transistor 308, thereby coupling the ground reference to the N-channel predriver output 310 at node $V_8$. The ground reference at node $V_8$ results in PMOS transistor 302 turning on as the potential difference (absolute value) between the gate and source exceeds the threshold voltage $V_{tp}$ for the PMOS device, thereby resulting in a conductive path forming from the source to the drain port in the PMOS transistor 302.

Simultaneously, the complementary NMOS transistor 306 turns off as the input to the gate of the NMOS transistor 306 received from the second inverter output signal 224 transitions the gate to source potential to less than the threshold potential $V_{tn}$ of the NMOS device. An open circuit is formed between the drain and source ports of the NMOS transistor 306, which when coupled with the conductive path realized by the on state of the PMOS transistor 302, yields a 3.3 V potential at node $V_7$. Finally, the 3.3 V potential coupled at node $V_7$ turns the PMOS transistor 304 off, a result of the gate to source potential. hlling below the (absolute value) threshold voltage $V_{tp}$ for the given PMOS device. Those of ordinary skill in the art will realize that as $V_{in}$ transitions back from a potential of 3.3 V–0 V, the exact opposite condition as described earlier will occur, resulting in transistors 302 and 308 turning off, while transistors 306 and 304 turn on in the N-channel predriver circuit 300 illustrated in FIG. 3, yielding a 3.3 V potential on the N-channel predriver output 310 at node $V_8$.

Figure 4:
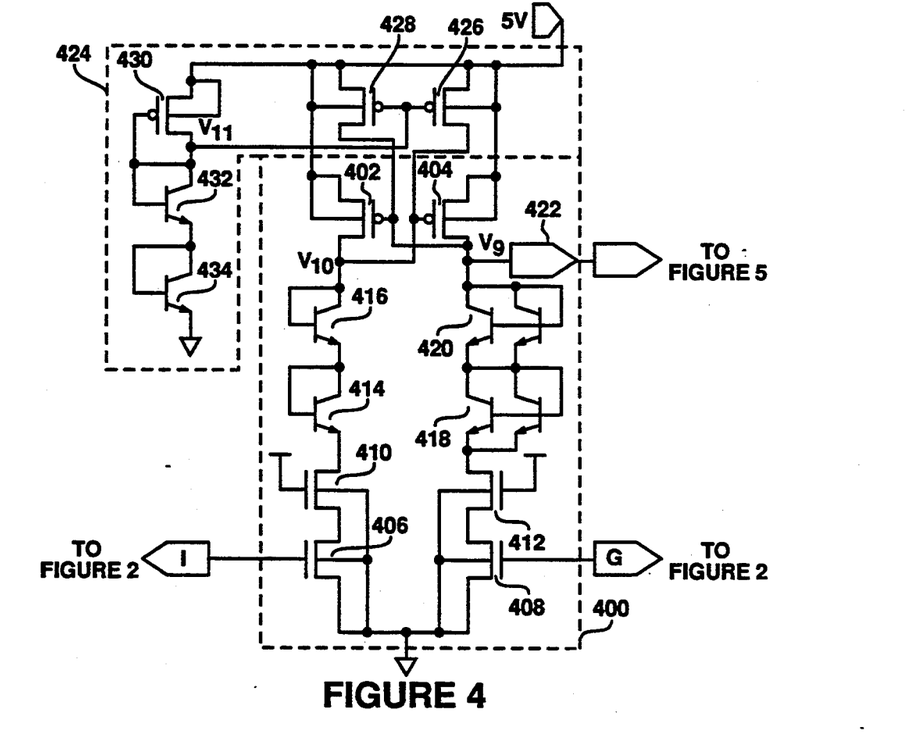
FIG. 4 is a schematic diagram of a P-channel predriver circuit of the preferred embodiment of the present invention.

Referring now to FIG. 4, a P-channel predriver 400 is shown comprising cross coupled enhancement mode PMOS transistors 402 and 404, enhancement mode NMOS transistors 406, 408, 410, and 412 and diodes 414, 416, 418 and 420. The source ports of the PMOS transistors 402 and 404 are coupled to a 5.0 V reference voltage, while the source ports in the NMOS transistors 406 and 408 are coupled to a ground reference. NMOS transistor 412 is cascaded with NMOS transistor 408, whereby the source port of the NMOS transistor 412 is coupled to the drain port of the NMOS transistor 408. Similarly, the NMOS transistor 410 is cascaded with the NMOS transistor 406.

The drain port of NMOS transistor 412 is connected to a series pair of diodes 418 and 420 which are connected anode to cathode. In the preferred embodiment of the present invention, the diodes 418,420 are formed from pairs of NPN transistors which have their base and collector nodes coupled, utilizing the devices' inherent base to emitter diode. The drain port of NMOS transistor 412 is coupled to the cathode of diode 418, whose anode is in turn coupled to the cathode of diode 420. In this configuration, the diodes realize approximately a 0.75 V potential difference from anode to cathode as a potential is applied across each device. Those of ordinary skill in the art will recognize that the selection of diodes assures that the gate to source voltages in the PMOS transistors 402 and 404 does not exceed 3.6 V maximum potential, while allowing each device to be referenced to a 5 V potential source. Similarly, those of ordinary skill in the an will recognize that the diode pairs are selected to optimize skew characteristics and help to offset the large capacitive load presented by the larger gate oxide PMOS transistors in the P-Channel drive circuit, which will be discussed in greater detail below.

NMOS transistor 410 is coupled at the drain port in a similar fashion to a second pair of series diodes 414 and 416. In the preferred embodiment of the present invention, single NPN transistors form diodes 414 and 416 utilizing the devices' inherent base to emitter diode.

The gate input of the PMOS transistor 404 is coupled to the drain port of the PMOS transistor 402 and to the anode of diode 416 at node $V_{10}$. The gate input of the PMOS transistor 402 is coupled to the drain port of PMOS transistor 404 and to the anode of diode 420 at node V$_9$, yielding P-channel predriver output 422. The gate inputs of NMOS transistors 410 and 412 are coupled to a 3.3 V reference potential. The gate input to NMOS transistor 408 is coupled to the first follower output 238 at node V$_5$ illustrated at connector G in FIG. 2, while the gate input of the NMOS transistor 406 is coupled to the first inverter output 214 at node V$_3$ illustrated at connector I in FIG. 2.

Referring still to FIG. 4, a bias circuit 424 comprising enhancement mode PMOS transistors 426, 428 and 430 and diodes 432 and 434 provides a small DC current to bias the diode pairs (418 and 420, 414 and 416) so as to create a steady state voltage during operation. In the preferred embodiment, the bias current is approximately 450 μA for the diode pairs. The source ports to the PMOS transistors 426, 428 and 430 are coupled to the 5 V reference potential. The drain port of PMOS transistor 430 is coupled to the anode of diode 432 and the gate inputs of PMOS transistors 426, 428 and 430 at node V$_1$. The cathode of diode 432 is coupled to the anode of diode 434, while the cathode of diode 434 is coupled to ground reference. The drain port of PMOS transistor 426 is coupled to the anode of diode 416 at node V$_{10}$, while the drain port of the PMOS transistor 428 is coupled to the anode of diode 420 at node V$_9$.

In the preferred embodiment of the present invention, the diodes are formed from single NPN transistors utilizing the devices' inherent base to emitter diode. Those of ordinary skill in the art will recognize that the PMOS transistors 426, 428 and 430 will always be turned on as the gate to source voltage for each device is more negative than the threshold voltage V$_{tp}$ for the PMOS devices. In addition, those of ordinary skill in the art will also recognize that the PMOS transistor 430 and series diode pair 432 and 434 prevent the drain to source voltages of PMOS transistors 426 and 428 from exceeding the desired maximum of 3.6 V potential across the device by providing a 1.5 V potential input at node V$_{11}$ while the PMOS transistor 430 is turned on.

In the preferred embodiment of the present invention, the PMOS transistors are fabricated of a gate width of 3 μm (transistgrs 426,428 and 430), 24 μm (transistor 402), and 48 μm (transistor 404) and a gate length of 0.6–0.7 μm, nominally; the NMOS transistors are hbricated of a gate width of 64 μm (transistors 406 and 410) and 72 μm (transistors 408 and 412) and a gate length of 0.6–0.7 μm, nominally; and the NPN transistors are fabricated of an emitter width of 2.4 μm.

According to the preferred embodiment of the present invention, as V$_{in}$ is varied from a potential of 0 V to 3.3 V, the first driver circuit 100 couples a 0 V to 3.3 V potential signal at the first driver output 110 to the first inverter 200 and first follower 204. The first follower 200 responds to the 0 V–3.3 V potential transition by providing a similar 0 V to 3.3 V potential transition via the first follower output 238 illustrated in FIG. 2 to the gate input of NMOS transistor 408 illustrated in FIG. 4. Simultaneously, the first inverter 200 provides a 3.3 V–0 V potential signal via the first inverter output 214 illustrated in FIG. 2 to the gate input of the NMOS transistor 406 of the P-channel predriver 400 illustrated in FIG. 4.

As the gate to source potential at NMOS transistor 408 exceeds the threshold V$_{tn}$ for the NMOS device, the NMOS transistor 408 turns on creating a conductive path between the drain and source ports of the NMOS transistor 408, thereby coupling the ground reference to the source port of the NMOS transistor 412. The NMOS transistor 412 will turn on as the gate to source potential reaches 3.3 V, thereby creating a conductive path from the drain to the source of the NMOS transistor 412 and resulting in the coupling of the cathode of diode 418 to the ground reference.

Bias circuit PMOS transistor 430 will remain on during steady state operations due to the −3.5 V gate to source potential realized whenever the 5 V supply reference is powered on. This will result in a 1.5 V potential at node V$_1$, thereby turning on PMOS transistors 426 and 428 as each of their respective gate to source voltages become more negative than the V$_{tp}$ for the PMOS devices. In the preferred embodiment of the present invention, the PMOS transistors 426 and 428 act as variable resistors, providing drive current for the diode pairs 414 and 416,418 and 420 As the PMOS transistor 428 conducts, a 1.5 V potential is realized at node V$_9$ due to the two diode drops across diodes 420 and 418 to ground, resulting in the P-channel predriver output 422 referenced at a potential of 1.5 V. The 1.5 V potential at node V$_9$ also results in PMOS transistor 402 turning on as the potential difference (absolute value) between the gate and source exceeds the threshold voltage V$_{tp}$ for the PMOS device, thereby forming a conductive path from the source to the drain port in the PMOS transistor 402.

Simultaneously, the complementary NMOS transistor 406 turns off as the input to the gate of the NMOS transistor 406 received from the first inverter output signal 214 illustrated in FIG. 2, transitions the gate to source potential to less than the threshold potential V$_{tn}$ of the NMOS device. An open circuit is formed between the drain and source ports of the NMOS transistor 406, which when coupled with the conductive path realized by the on state of the PMOS transistor 402, yields a 5.0 V potential at node V$_{10}$. Finally, the 5.0 V potential coupled at node V$_{10}$ results in the PMOS transistor 404 turning off, a result of the gate to source potential falling below the (absolute value) threshold voltage V$_{tp}$ for the given PMOS device. Those of ordinary skill in the art will realize that as V$_{in}$ transitions back from a potential of 3.3 V–0 V, the exact opposite condition as described above will occur, resulting in transistors 402, 408 and 412 turning off, while transistors 404, 406 and 410 turn on in the P-channel predriver circuit 400, yielding a 5.0 V potential on the P-channel predriver output 422 at node V$_9$.

Figure 5:
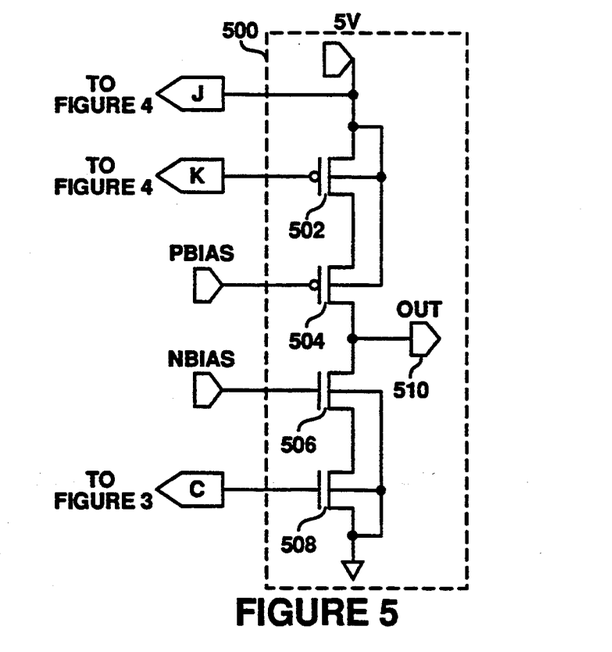
FIG. 5 is a schematic diagram of the main driver circuit of the preferred embodiment of the present invention.

Referring now to FIG. 5, a main driver 500 is shown comprising enhancement mode PMOS transistors 502 and 504, and enhancement mode NMOS transistors 506 and 508. The source port of the PMOS transistor 502 is coupled to a 5.0 V reference voltage, while the source port in the NMOS transistor 508 is coupled to a ground reference. NMOS transistor 506 is cascaded with NMOS transistor 508, whereby the source port of the NMOS transistor 506 is coupled to the drain port of the NMOS transistor 508. Similarly, the PMOS transistor 502 is cascaded with the PMOS transistor 504, whereby the drain of the PMOS transistor 502 is coupled to the source of PMOS transistor 504. Finally, the drain port of PMOS transistor 504 is coupled the drain port of the NMOS transistor 506, resulting in the main driver output 510.

The gate input of the PMOS transistor 502 is coupled to the P-channel predriver 400 by the P-channel predriver output 422 at node V$_9$ illustrated at connector K in FIG. 4. The gate input of the NMOS transistor 508 is coupled to the N-channel predriver 300 by the N-channel predriver output 310 at node V₈ illustrated at connector C in FIG. 3. The gate input of PMOS transistor 504 is connected to a 1.7 V reference at node PBIAS illustrated in FIG. 5, while the gate input of the NMOS transistor 506 is coupled to a 3.3 V reference at node NBIAS. In the preferred embodiment of the present invention, a voltage source referenced from 5 V and divided to the correct levels (1.7 V and 3.3 V respectfully) can be implemented. However, those of ordinary skill in the art will recognize that while the selection of voltage levels provides protection for the 504 and 506 transistors, the values may be varied as required as long as a 3.6 V maximum device voltage is not exceeded.

In the preferred embodiment of the present invention, the PMOS transistors are fabricated of a gate width of 570 $\mu$m and a gate length of 0.9 $\mu$m, nominally, while the NMOS transistors are fabricated of a gate width of 270 $\mu$m and a gate length of 0.9 $\mu$m, nominally.

According to the preferred embodiment of the present invention, as $V_{in}$ is varied from a potential of 0 V to 3.3 V, the first driver circuit 100 couples a 0 V to 3.3 V potential signal at the first driver output 110 to the first inverter 200 and second inverter 202 and first follower 204 and second follower 206. The followers 204, 206 respond to the 0 V–3.3 V potential transition by providing a similar 0 V to 3.3 V potential transition via the first follower output 238 and second follower output 248 to the N-channel predriver 300 illustrated in FIG. 3 and to the P-channel predriver 400 illustrated in FIG. 4. Simultaneously, the first inverter 200 and second inverter 202 provide a 3.3 V–0 V potential signal via the first inverter output 214 and second inverter output 224 to the N-channel predriver 300 and to the P-channel predriver 400.

P-channel predriver 400 outputs a 1.5 V reference signal via the P-channel predriver output 422 at node V₉ illustrated in FIG. 4, thereby causing the PMOS transistor 502 illustrated in FIG. 5 to turn on as the gate to source voltage level exceeds the threshold level (absolute value) for the particular device. A conductive path forms from the source to the drain ports in the PMOS transistor 502, resulting in a 5 V potential at the source port of PMOS transistor 504. With a source port referenced to 5 V and PBIAS referenced to 1.7 V, the gate to source voltage will exceed the transition voltage $V_{tp}$ (absolute value) for the PMOS transistor 504, thereby turning on the PMOS transistor 504. In the onstate, PMOS transistor 504 forms a conductive path from the source to the drain and provides a 5 V reference output signal at the main driver output 510.

N-channel predriver 300 outputs a 0 V reference signal via the N-channel predriver output 310 at node V₈ illustrated in FIG. 3 thereby causing the NMOS transistor 508 illustrated in FIG. 5 to turn off as the gate to source voltage level falls below the threshold level $V_{tn}$ (absolute value) for the particular device. An open circuit forms from the source to the drain ports in the NMOS transistor 508, resulting in a 2.5 V potential at the source port of NMOS transistor 506 as the open input source port floats to a $V_{tn}$ (absolute value) below the NBIAS voltage. With the drain port of NMOS 506 referenced to 5 V and NBIAS referenced to 3.3 V, the source port of NMOS 506 will not exceed 2.5 V. This has the effect of dropping the 5 V at node OUT equally across NMOS transistors 506 and 508 and ensures the drain to source voltages on NMOS transistors 506 and 508 individually remain below 3.3 V. Those of ordinary skill in the art will realize, that as $V_{in}$ transitions back from 3.3 V to 0 V potential, the exact opposite condition as described will occur, whereby the PMOS transistors 502 and 504 will remain turned off, while the NMOS transistors 506 and 508 are turned on providing a 0 V potential output at the main driver output 510.

In a second embodiment of the present invention, the voltage sources connected at PBIAS and NBIAS are varied so as to provide a variable output impedance from 50Ω–10MΩ, depending on the voltage level selected. The variable impedance is achieved by driving the PMOS transistor 504 (or the NMOS transistor 506) into the saturation region by varying the gate to source voltage. When either PMOS transistor 504 or NMOS transistor 506 are in full conduction, that is the when the gate to source voltage is much greater than the transition threshold voltage, the output impedance of the main driver output 510 is approximately 50Ω–80 Ω. As the gate to source voltage is brought nearer the threshold level, the PMOS (NMOS) devices act as variable resistors, whereby the output impedance (impedance as seen looking back into the device) varies with voltage for devices in saturation.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

We claim:

1. In a digital integrated circuit, an interface apparatus for interfacing between an input source and a second volt receiving device comprising:
   a first predriver for receiving a first input signal from said input source and for generating a first predriver output signal, said first predriver output signal variable from a first voltage to a second voltage as said first input signal varies from a third voltage to a fourth voltage, said first predriver including:
   (a) a first and second transistor having gate source and drain ports, said first and second transistors cross coupled between said gate and drain ports with source ports referenced to said first voltage, a first control signal switchably generated by said drain of said first transistor or said drain of said second transistor;
   (b) a first and second diode pair coupled to said first and second transistors at a first and second drain port, said diode pairs for preventing transistor voltages from exceeding a limit voltage; and
   (c) a first receiving circuit coupled to said first and second diode pairs for receiving said first input signal;
   a second predriver for receiving said first input signal from said input source and for generating a second predriver output signal, said second predriver output signal variable from said fourth voltage to said third voltage as said first input signal varies from said third voltage to said fourth voltage, said second predriver including a third and fourth transistor having gate source and drain ports, said third and fourth transistors cross coupled between said gate and drain ports with source ports referenced to said fourth voltage, a second control signal switchably generated by said drain of said third transistor or said drain of said fourth transistor; and a main driver coupled to said first predriver and said second predriver by said first and second predriver output signals, said main driver having an output circuit for generating a main output signal variable from said third voltage to said first voltage as said first input signal varies from said third voltage to said fourth voltage in response to said first and second predriver output signals.

2. In a digital integrated circuit, an interface apparatus for interfacing between an input source and a receiving device comprising:

a receiving circuit, responsive to a first input signal from said input source, for generating a first and second control signal as said first input signal varies from a first voltage to a second voltage;

a driver coupled to said receiving circuit by said first and second control signals, said driver referenced to a third voltage and a fourth voltage, said driver having a main driver output, said driver responsive to said first and said second control signals, said main driver output varying from said third voltage to said fourth-voltage as said first input signal varies from said first voltage to said second voltage in response to said first and second control signals, wherein said receiving circuit comprises a P-channel receiver and a N-channel receiver, said P-channel receiver for generating said first control signal and said N-channel receiver for generating said second control signal.

3. The interface apparatus of claim 2 wherein said P-channel receiver comprises:

(a) a first and second transistor, said transistors having a gate, source and drain port, said first transistor coupled to said second transistor from said gate port to said drain port, said second transistor coupled to said first transistor from said gate port to said drain port, said source port of both said first and second transistors coupled to a 5 volt reference;

(b) a first and second pair of level shifting diodes, each diode of said diode pair having an anode and cathode end, said diode pair formed by coupling one diode's anode end to a second diode's cathode end, thereby forming a diode pair having a first diode pair anode and a first diode pair cathode for coupling to said P-channel receiver, said first diode pair coupled to said first transistor from said first diode pair anode to said drain port, said second diode pair identical to said first diode pair including a second diode pair anode and second diode pair cathode, said second diode pair coupled to said second transistor from said first anode to said drain port;

(c) a first and second cascaded transistor pair, said cascaded transistor pair comprising a third transistor coupled to a fourth transistor from source to drain, with a gate of said third transistor referenced to 3.3 volts, and a drain of said fourth transistor referenced to 0 volts, said first cascaded transistor pair coupled from a drain port of said third transistor to said fist diode pair at said first diode pair cathode, said second cascaded transistor pair coupled from a drain port of said third transistor to said second diode pair at said second diode pair cathode;

(d) one of said cascaded pairs coupled at a gate port of said fourth transistor to said first input signal, said second cascaded pair coupled at a gate port to a first inverter, said first inverter coupled to said first input signal for inverting said first input signal prior to coupling said first input signal to said second cascaded pair; and (e) a first output port for generating said first control signal, said first output port coupled to said first diode pair at said first diode pair anode, whereby as said first input signal varies from 0 volts to 3.3 volts, said first cascaded transistor pair conducts driving said first transistor to conduct and thereby generating a 1.5 V potential at said first output port, simultaneously said second cascaded transistor pair switches off, turning off said second transistor thereby removing a 5.0 V potential from said first output port.

4. The interface apparatus of claim 2 wherein said N-channel receiver comprises:

(a) a fifth and sixth transistor, said transistors having a gate, source and drain port, said fifth transistor coupled to said sixth transistor from said gate port to said drain port, said sixth transistor coupled to said fifth transistor from said gate port to said drain port, said source port of both said fifth and sixth transistors coupled to a 3.3 volt reference;

(b) a seventh and eighth transistor having source ports coupled to a ground reference and drain ports coupled to said drain ports of said fifth and sixth transistors respectively, said seventh transistor coupled at a gate port to said first input signal, said eighth transistor coupled at a gate port to a second inverter, said second inverter coupled to said first input signal for inverting said first input signal prior to coupling said first input signal to said eighth transistor (c) a second output port for generating said second control signal, said second output port coupled to said sixth transistor at said drain port, whereby as said first input signal varies from 0 volts to 3.3 volts, said eighth transistor conducts driving said fifth transistor to conduct and thereby generating a 0 volt potential at said second output port, simultaneously said seventh transistor switches off, turning off said second sixth transistor thereby removing a 3.3 volt potential from said second output port.

5. The interface apparatus of claim 2, wherein said driver circuit comprises:

(a) a third cascaded transistor pair comprising an first upper and first lower transistor, said first upper transistor and first lower transistor having a drain, source and gate port, said first upper transistor coupled to said first lower transistor from drain port to source port, said first upper transistor coupled to a 5 volt reference at said source port, said gate of said first upper transistor coupled to said receiving circuit by said first control signal, said gate port of said first lower transistor coupled to a 1.7 volt reference;

(b) a fourth cascaded transistor pair comprising a second upper and second lower transistor, said second upper transistor and second lower transistor having a drain, source and gate port, said second upper transistor coupled to said second lower transistor from said source port to said drain port, said second lower transistor coupled to a 0 volt reference at said source port, said gate of said second lower transistor coupled to said receiving circuit by said second control signal; said second upper transistor coupled to a 3.3 volt reference at said gate port, said third cascaded transistor pair coupled to said fourth cascaded transistor pair at a first junction from said drain port of said second upper transistor to said drain port of said first lower transistor;

(c) a main driver output signal, said main driver output signal tapped from said first junction between said third and fourth cascaded transistor pairs.

6. The interface apparatus of claim 3 wherein said first and second transistors are enhancement mode PMOS transistors fabricated from a 3.3 volt BiCMOS process.

7. The interface apparatus of claim 3 wherein said third and fourth transistors are enhancement mode NMOS transistors fabricated from a 3.3 volt BiCMOS process.

8. The interface apparatus of claim 4 wherein said fifth and sixth transistors are enhancement mode PMOS transistors fabricated from a 3.3 volt BiCMOS process.

9. The interface apparatus of claim 4 wherein said seventh and eighth transistors are enhancement mode NMOS transistors fabricated from a 3.3 volt BiCMOS process.

10. The interface apparatus of claim 5 wherein said first upper and lower transistors are enhancement mode PMOS transistors fabricated from a 3.3 volt BiCMOS process.

11. The interface apparatus of claim 5 wherein said second upper and lower transistors are enhancement mode NMOS transistors fabricated from a 3.3 volt BiCMOS process.

12. In a digital integrated circuit, an apparatus for interfacing between a 3.3 volt input source and a 5.0 volt receiving device comprising:

a P-channel predriver, said predriver for receiving a first input signal from said input source and for generating a first predriver output signal, said first predriver output signal swingable from 5 volts to 1.5 volts as said first input signal varies from 0 volts to 3.3 volts, said predriver comprising:

(a) a first and second transistor having gate source and drain ports, said first and second transistors cross coupled between gate and drain ports with source ports referenced to 5 volts, said first control signal switchably generated by drain of said first and said drain of said second transistor;

(b) a first and second pair of level shifting diodes coupled to said first cross coupled pair of transistors at a first and second drain port, said diode pairs for preventing transistor voltages from exceeding 3.6 volts;

(c) a first receiving circuit coupled to said first and second pair of level shifting diodes for receiving said first input signal;

a N-channel predriver, said predriver for receiving said first input signal from said input source and for generating a second predriver output signal, said second predriver output signal swingable from 3.3 volts to 0 volts as said first input signal varies from 0 volts to 3.3 volts, said N-channel predriver comprising a third and fourth transistor having gate source and drain ports, said third and fourth transistors cross coupled between gate and drain ports with source ports referenced to 3.3 volts, said second control signal switchably generated by said drain of said third and drain of said fourth transistor; and a main driver, said main driver coupled to said P-channel predriver and said N-channel predriver by said first and second predriver output signals, said main driver having an output circuit for generating a main output signal swingable from 0 volts to 5 volts as said first input signal varies from 0 volts to 3.3 volts in response to said first and second predriver output signals, said output circuit including impedance matching circuit for selectably setting the output impedance of said main driver so as to properly interface with said 5 volt receiving device.

13. The interfacing apparatus of claim 12 wherein said output circuit comprises:

(a) a cascaded transistor pair comprising a first upper and first lower transistor, said first upper transistor and first lower transistor having a drain, source and gate port, said first upper transistor coupled to said first lower transistor from drain port to source port, said first upper transistor coupled to a 5 volt reference at said source port, said gate of said first upper transistor coupled to said receiving circuit by said first predriver output signal, said gate port of said first lower transistor coupled to said impedance matching circuit;

(b) a fourth cascaded transistor pair comprising a second upper and second lower transistor, said second upper transistor and second lower transistor having a drain, source and gate port, said second upper transistor coupled to said second lower transistor from said source port to said drain port, said second lower transistor coupled to a 0 volt reference at said source port, said gate of said second lower transistor coupled to said receiving circuit by said second control signal; said second upper transistor coupled to said impedance matching circuit at said gate port, said third cascaded transistor pair coupled to said fourth cascaded transistor pair at a first junction from said drain port of said second upper transistor to said drain port of said first lower transistor.

14. The interface apparatus of claim 13 wherein said impedance matching circuit comprises a first and second variable voltage source, said first variable voltage source coupled to said gate of said first lower transistor, said second variable voltage source coupled to said gate of said second upper transistor, said first lower transistor and second upper transistor having a threshold voltage $V_t$ at full conduction, wherein said output impedance of said output circuit is adjustable as said first and second variable voltage sources vary the gate to source voltage of said first lower transistor and said second upper transistor over the range from 0 volts to the absolute value of $V_t$ volts.

* * * * *

UNITED STATES PATENT AND TRADEMARK OFFICE
CERTIFICATE OF CORRECTION

PATENT NO. : 5,410,267
DATED : April 25, 1995
INVENTOR(S) : Haycock et al.

Page 1 of 3

It is certified that error appears in the above-indentified patent and that said Letters Patent is hereby corrected as shown below:

delete "tums" and substitute --turns--:
        col. 3, ln. 35
        col. 3, ln. 40
        col. 3, ln. 57
        col. 3, ln. 60
        col. 6, ln. 4
        col. 8, ln. 29 delete "tuming" and substitute --turning--:
        col. 3, ln. 67
        col. 8, ln. 23
        col. 8, ln. 39
        col. 8, ln. 45
        col. 9, ln. 48 delete "tum" and substitute --turn--:
        col. 3, ln. 68
        col. 6, ln. 20
        col. 6, ln. 45
        col. 8, ln. 2 delete "tumed" and substitute" --turned--:
        col. 7, ln. 31
        col. 7, ln. 40

, delete "extemal" and substitute --external--:
        col. 1, ln. 32
        col. 1, ln. 36
        col. 2, ln. 10

UNITED STATES PATENT AND TRADEMARK OFFICE
CERTIFICATE OF CORRECTION

PATENT NO. : 5,410,267
DATED : April 25, 1995
INVENTOR(S) : Haycock et al.

Page 2 of 3

It is certified that error appears in the above-indentified patent and that said Letters Patent is hereby corrected as shown below:

In column 2, at line 2, delete "interfhcin g" and substitute --interfacing--.

In column 2, at line 11, delete "Specitically" and substitute --Specifically--.

In column 3, at line 7, delete the "in" between "$V_{in}$" and "is".

In column 3, at line 39, delete "$V_p$" and substitute --$V_{tp}$--.

In column 3, at line 60, delete "refl.ecting" and substitute --reflecting--.

In column 5, at line 60, delete "Vm" and substitute --$V_{tn}$--.

In column 6, at line 14, delete "potential. hlling" and substitute --potential falling--.

In column 6, at line 54, delete "an" and substitute --art--.

In column 7, at line 21, delete "$V_1$" and substitute --$V_{11}$--.

In column 7, at line 43, delete "transistgrs" and substitute --transistors--.

UNITED STATES PATENT AND TRADEMARK OFFICE
CERTIFICATE OF CORRECTION

PATENT NO. : 5,410,267
DATED : April 25, 1995
INVENTOR(S) : Haycock et al.

It is certified that error appears in the above-indentified patent and that said Letters Patent is hereby corrected as shown below:

In column 7, at lines 45-46, delete "hbricated" and substitute --fabricated--.

In column 8, at line 11, delete "$V_1$" and substitute --$V_{11}$--.

Signed and Sealed this

Tenth Day of December, 1996

BRUCE LEHMAN

*Attest:*

*Attesting Officer*     *Commissioner of Patents and Trademarks*